US006900395B2

(12) United States Patent
Jozwiak et al.

(10) Patent No.: US 6,900,395 B2
(45) Date of Patent: May 31, 2005

(54) ENHANCED HIGH-FREQUENCY VIA INTERCONNECTION FOR IMPROVED RELIABILITY

(75) Inventors: Janet L. Jozwiak, Wappingers Falls, NY (US); Gregory B. Martin, Wappingers Falls, NY (US); Linda L. Rapp, Poughkeepsie, NY (US); Srinivasa S. Reddy, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 255 days.

(21) Appl. No.: 10/306,756

(22) Filed: Nov. 26, 2002

(65) Prior Publication Data

US 2004/0100754 A1 May 27, 2004

(51) Int. Cl.[7] .......................... H05K 1/11; H01R 12/04
(52) U.S. Cl. .................... 174/264; 174/262; 174/258; 361/767; 257/698
(58) Field of Search ............................. 174/255, 262, 174/264, 261, 260, 256, 263; 361/762, 760, 777, 767, 808; 257/698

(56) References Cited

U.S. PATENT DOCUMENTS

| | | | |
|---|---|---|---|
| 5,260,519 A | 11/1993 | Knickerbocker et al. | |
| 5,549,778 A | 8/1996 | Yokoyama et al. | |
| 5,552,107 A | 9/1996 | Casey et al. | |
| 5,627,344 A | * 5/1997 | Tanifuji et al. | 174/257 |
| 5,831,219 A | * 11/1998 | Kobayashi et al. | 174/261 |
| 5,855,995 A | * 1/1999 | Haq et al. | 428/210 |
| 5,937,321 A | * 8/1999 | Beck et al. | 438/622 |
| 6,136,419 A | 10/2000 | Fasano et al. | |
| 6,312,791 B1 | 11/2000 | Fasano et al. | |
| 6,190,790 B1 | * 2/2001 | Nagata | 428/701 |
| 6,265,090 B1 | * 7/2001 | Nishide et al. | 428/701 |

FOREIGN PATENT DOCUMENTS

JP          06125178 A  *  5/1994

* cited by examiner

Primary Examiner—Kamand Cuneo
Assistant Examiner—Ishwar (I. B.) Patel
(74) Attorney, Agent, or Firm—DeLio & Peterson LLC; Robert Curcio; Ira D. Blecker

(57) ABSTRACT

Replacements of thick film pads with smaller, thinner, metal contacts or straps are used to eliminate many of the stress-related failure modes associated with the larger contact pads. These straps allow for a more simplified manufacturing process than that associated with an anchored I/O pad configuration. A single via, electrically connected to a plurality of vias in a substrate layer above, is introduced to enhance the reliability of the signal net, and provides for higher frequency applications through reduction in parasitic capacitance and electrical leakage. The straps are directionally located toward the substrate center. Once the locations of the internal strap vias are redirected to lower local distance-to-neutral points, still within the same I/O capture pad, and directed towards the center of the substrate, single vias are then placed at the strap end closest the substrate center.

11 Claims, 4 Drawing Sheets

US 6,900,395 B2

ENHANCED HIGH-FREQUENCY VIA INTERCONNECTION FOR IMPROVED RELIABILITY

BACKGROUND OF THE INVENTION

1. Field of the Invention

This invention relates to multilayer ceramic substrates designed to improve the mechanical and electrical reliability of surface mounted features. More particularly, the invention relates to ceramic substrates having a plurality of vias conductively connected by metal straps, having certain vias directionally located nearest to the center of the substrate, and the metal straps pointing in a predetermined location towards the substrate center, and methods for making the same.

2. Description of Related Art

As semiconductor technology moves towards increasingly higher speeds and higher reliability, high performance ceramic packaging becomes a requisite necessity to integrated circuit design. Within the high frequency, high performance electronic packages, electrical leakages are amplified by the parallel paths of multiple conductive vias within the multiple layers of the final substrate. Interconnection between buried conductor levels within a layered substrate is usually achieved through a plurality of vias, which are formed prior to the lamination of the multiple layers. Ideally, fewer vias would reduce the unwanted parasitic capacitances and resultant leakages. In the design limit, only one via is optimally desired in a single layer in order to eliminate the parallel path leakages and maintain high frequency electrical performance requirements when connecting signal features between the multiple layers. Left unchecked, the parasitic capacitance would dominate the high frequency performance characteristics of the substrate. Thus, a layer having a single via, if functionally and reliably achievable, would enhance the operational reliability of a high frequency signal net.

The reliability of the electrical connections between the ceramic substrate and a printed circuit board is generally affected by a number of parameters, which include the difference in the coefficient of thermal expansion (CTE) between the substrate and the board, the comparative stiffness between the substrate and the board, the size of the solder array, and height of the solder joint, to name a few. The board and substrate expand and contract during thermal cycling, causing strain in the solder connections between the two, with the greatest strain occurring at the outermost connections relative to the center of the solder array. In this manner, repetitive thermal cycling will eventually fatigue the solder connections to failure, creating openings or discontinuities in the electrical pathways between the ceramic substrate and the board. A layered substrate design that is capable of reducing this strain would ultimately enhance the life and reliability of the substrate.

Typically, a multilayer ceramic substrate is manufactured by the following conventional method. First, a plurality of holes is formed through a green sheet of glass-ceramics, and these holes are filled with copper paste to form a plurality of vias. Then, copper paste is screen-printed on the green sheet to form a plurality of thick film pads connected to the vias, and a plurality of thick film patterns are connected to the thick film pads. The green sheet is then dried. A number of green sheets are prepared in this manner, and laminated and bonded together through the application of heat and pressure. The bonded green sheets are then sintered to manufacture a multiple layered ceramic substrate.

When electrical performance requirements are not as rigid, several redundant vias can be used to connect the I/O pad to an internal anchor pad. Generally, the multiple vias are arranged so as to allow as many vias as will fit within the area of a subsequent surface feature, such as the I/O pad. In order to provide and ensure electrical continuity, however, each via from a first layer is aligned with a corresponding via from a second layer. An exception to this can be found in U.S. Pat. No. 5,549,778 issued to Yokoyama, et al., on Aug. 27, 1996, entitled "MANUFACTURING METHOD FOR MULTILAYER CERAMIC SUBSTRATE." In Yokoyama, "dummy" vias are taught to help anchor the surface feature (pad) to the underlying ceramic. These dummy vias are nonfunctioning and merely serve to mechanically assist in the anchoring of the surface feature. The dummy vias provide no electrical continuity with vias in the underlying layers.

Multiple, redundant vias can be detrimental in high frequency, high performance packages. Parasitic losses are increased at higher frequencies, with the losses amplified by the number of parallel via paths introduced in each layer. Additionally, in an anchored pad configuration, an original via structure places the interconnection via in alignment with the signal via at the next layer in the package. This often results in the via being located at the outermost or center location on the I/O pad, which is the higher stress location, at a higher local distance-to-neutral point (DNP), and becomes an early failure location as the via is stressed under tensile and shear during machine thermal cycling. Vias under these conditions become fatigued and fractured. The further the via is located away from the substrate center, the more stress and strain it will undergo.

In U.S. Pat. No. 6,312,791 issued to Fasano, et al., on Nov. 6, 2001, entitled "MULTILAYER CERAMIC SUBSTRATE WITH ANCHORED PAD," multiple vias are anchored to a surface pad of the first, bottom layer, with at least one of the anchored vias in electrical contact with vias in other layers above. Specifically, Fasano teaches having the outer pad attached to the multilayer ceramic substrate, which is anchored to a middle pad of the substrate by a plurality of vias, which in turn are anchored to an inner pad of the substrate by a second plurality of vias. In each instance, a thick film contact pad is utilized to form electrical continuity among vias. Additionally, multiple vias are constructed in the innermost layers, connected to I/O pads. Outer layers are shown with a single via electrically connected to a single via in a layer below. Importantly, no attempt is made to reduce the tensile and shear stresses on the vias by placing them closer to the substrate center.

Bearing in mind the problems and deficiencies of the prior art, it is therefore an object of the present invention to provide a multilayered ceramic substrate with a plurality of vias, having improved high frequency reliability and high electrical performance.

It is another object of the present invention to provide a multilayered ceramic substrate with a plurality of vias, having a standard via grid, that under high frequency applications does not increase parasitic capacitance or electrical leakage.

A further object of the invention is to provide a multilayered ceramic substrate with a plurality of vias that eliminates early failures on high local distance-to-neutral point vias.

It is yet another object of the present invention to provide a multilayered ceramic substrate with a plurality of vias that allows for increased application space for the electronic package.

Still other objects and advantages of the invention will in part be obvious and will in part be apparent from the specification.

SUMMARY OF THE INVENTION

The above and other objects and advantages, which will be apparent to one of skill in the art, are achieved in the present invention, which is directed to, in a first aspect, a multilayer ceramic package comprising: a plurality of ceramic layers having conductors thereon, including a first outer layer and a second layer adjacent to the first outer layer; a plurality of vias extending from the first outer layer to the second layer; a plurality of metallic straps on the second layer corresponding to and contacting the plurality of vias. The first outer layer includes a plurality of contact pads, each of the contact pads electrically connecting to a portion of the plurality of vias. Further, each of the plurality of metallic straps connects to a single via, such that each of the via portions is electrically connected to each of the single via of the metallic strap. The metallic straps have a length and a width, the length greater than the width, the length extending across and at least as long as the contact pad diameter.

The multilayer ceramic package also includes center vias electrically connected to each of the contact pads, each of the center vias directly above, corresponding to, and individually electrically connected to, one of the single vias. All of the metallic straps aligned in such a manner as to point to the center of the second layer.

In a second aspect, the present invention is directed to a multilayered ceramic substrate having a substrate center, comprising: a first outer layer having a plurality of I/O pads, each of the I/O pads having a plurality of I/O pad vias including a center via; a plurality of single vias in a second layer corresponding to each of the I/O pads, each of the single vias located underneath and in electrical contact with some of the plurality of I/O pad vias and each of the I/O pad center vias; and a plurality of metallic straps, each one corresponding to each of the single vias in the second layer, electrically connecting the single vias with some of the plurality of I/O pad vias and the center via. The multilayer ceramic package includes having the metallic straps aligned in such a manner as to point to the center of the second layer. The plurality of I/O pad vias is located about the I/O pad in a circular fashion, forming circumferential vias and the center via. Each of the single vias is located directly underneath the circumferential via closest to the substrate center.

In a third aspect, the present invention is directed to a method of making a multilayered ceramic substrate, having a substrate center, comprising: forming a plurality of holes in a first green sheet; forming a plurality of vias in the first green sheet; forming a plurality of conductive metallic straps, each of the straps connecting to some of the plurality of vias; and laminating and bonding the green sheet to a second green sheet having a second plurality of vias. Each of the plurality of vias in the first green sheet individually correspond to its own metallic strap from the plurality of conductive metallic straps, such that there exists a single via electrically connected to each metallic strap. Further, the metallic straps are directionally located to point towards the substrate center. Forming a plurality of vias further comprises filling the holes with copper paste, copper alloy, nickel, or silver. Some of the plurality of vias in the second green sheet may be connected to I/O pads. The conductive metallic straps may be comprised of screen-printing metallic paste in the shape of the straps on a surface of the first green sheet. Each of the single vias may be located at a point on the metallic strap closest to the substrate center. The method further comprises laminating and bonding the first and second green sheets to a plurality of green sheets each having a plurality of vias and I/O pads.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
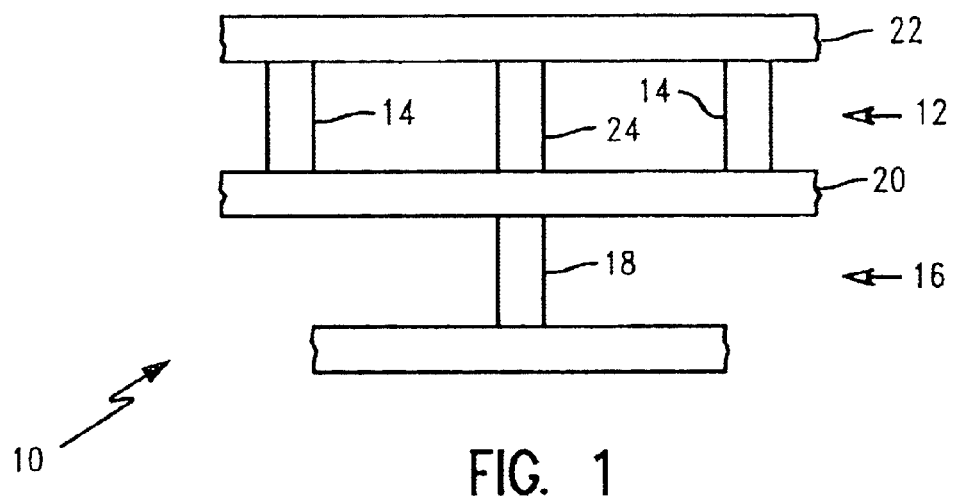
FIG. 1 is a cross-sectional view of the multilayered ceramic substrate of the present invention.

In describing the preferred embodiment of the present invention, reference will be made herein to FIGS. 1–6 of the drawings in which like numerals refer to like features of the invention. Features of the invention are not necessarily shown to scale in the drawings.

The first layer in from the bottom of a multilayered ceramic structure, commonly referred to as the BSM-1 layer, includes contact pads for contacting a plurality of vias from the layer above it, referred to as the BSM layer. The ceramic that comprises the multilayer ceramic substrate is most preferably a high performance, low temperature cofired ceramic. However, the present invention may have applicability to all ceramic-based components where surface pad reliability is of a concern. The contact pad is usually a thick film pad, which can be an anchored I/O pad as previously taught in the art. The wide footprint of the thick film contact pad, its thickness, and multiple bonding points to the plurality of vias, provide losses due to parasitic capacitance. A replacement of the thick film pad with a smaller, thinner, metal contact or strap minimizes capacitance related losses at high frequencies within the layer. Typically, the outermost (BSM) layer of a multilayered ceramic substrate has multiple vias, which in turn are contacted to multiple I/O pads that then connect to multiple vias underneath. The instant invention simplifies this structure using straps in place of I/O pads to electrically connect multiple vias in the BSM layers to a single via in the inner or lower (BSM-1) layer. At high frequency, high performance electronic applications, a minimum number of vias is desired to reduce the parallel paths and maintain high frequency electrical performance requirements when connecting signal features between layers. Consequently, the implementation of a design utilizing a single via, electrically connected to a plurality of vias in a layer above, enhances the reliability of the signal net, and provides for higher frequency applications.

Figure 2:
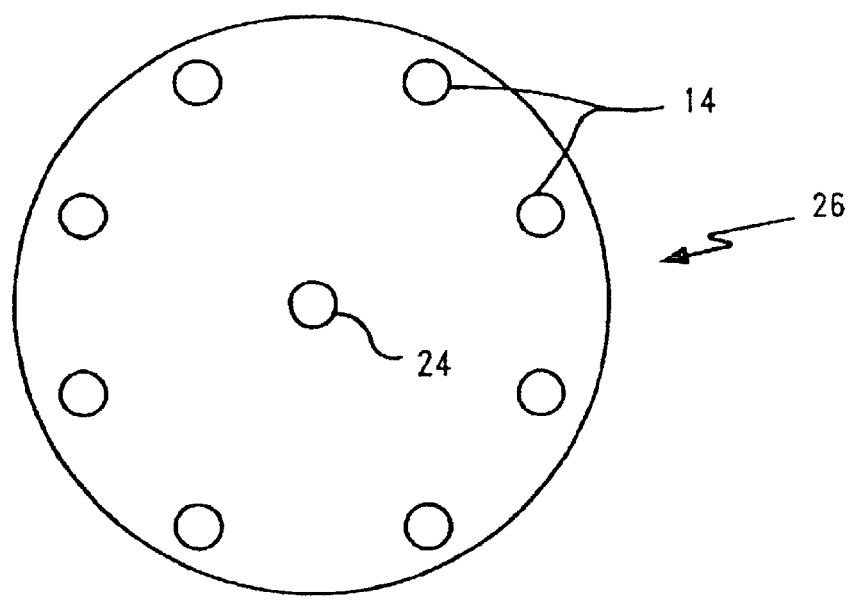
FIG. 2 is an overhead view of an I/O pad having multiple vias about its periphery along with a center via.

As depicted in FIG. 1, a multilayered ceramic substrate 10 of the present invention is shown with an outer or first layer 12, referred to as a BSM layer, having multiple vias 14, including a center via 24, an I/O pad 22 located above vias 14, a single via 18 in a lower or second layer 16, referred to as the BSM-1 layer, and a single strap, bus bar, or metallic wire 20, replacing what would otherwise be an internal thick film pad or anchor pad, electrically connecting single via 18 with the multiple vias 14 and center via 24. The strap 20 is simpler to manufacture, and can be placed to provide directionality to the center of the substrate. Generally, vias 14 are located about an I/O pad or anchor pad in a circular fashion as depicted in FIG. 2. These vias are usually arranged so as to allow as many vias 14 as will fit within the area of a subsequent surface feature, or as shown here, a pad 26, including center via 24. Typically, the vias are between 50 and 150 microns for I/O pad diameters of approximately 600 to 850 microns that are used in 50 mil pitch CBGA solder connections. The preferable via metal is copper while alloys of nickel, copper, silver, and the like, may also be used. The metal content of the vias and strap should be at least 80% by volume and preferably 100%. As shown in FIG. 2, the I/O pad has multiple vias about its periphery 14, and a center via 24. A single via in the second layer, referred to as the internal anchor via or strap via, is then electrically connected to the center via through the metallic strap as previously indicated by FIG. 1.

Figure 3:
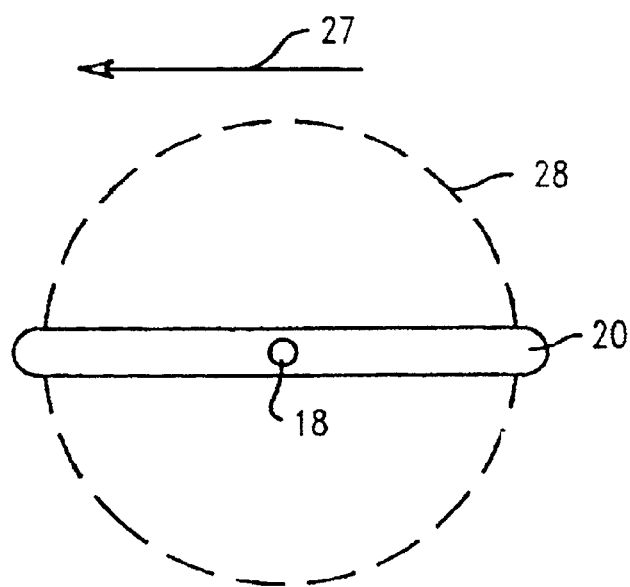
FIG. 3 is a top-view schematic of the single center via of a BSM-1 layer attached to a metal strap.

Typically, in high performance, high frequency packages, the original via structure places the interconnection via in alignment with the signal via at the next layer in the package. FIG. 3 depicts a top-view schematic of the single center via 18 of the BSM-1 layer attached to the metal strap 20. The single via 18 in a buried layer underneath an I/O pad, generally centered about the pad, and in the instant example, specifically underneath center via 24. Dotted line 28 represents the coverage of the I/O pad footprint. Via 18 is depicted at the center of the Strap. Strap 20 extends from one end of the I/O pad's circumference to the other end. The strap may be screened onto the outside surface of the substrate's layer in order to make electrical contact with the via. For illustrative purposes, the direction of the substrate center is indicated by arrow 27. Importantly, the further the single via 18 is away from the substrate center, the more it will be subjected to tensile and shear stresses during thermal recycling and under normal operation. Moreover, the fewer vias there are in the BSM-1 layer, the less parasitic capacitance and leakage will be prevalent in high frequency applications. Since multiple I/O pads are present on a ceramic substrate, multiple straps would be present in their replacement.

Figure 4:
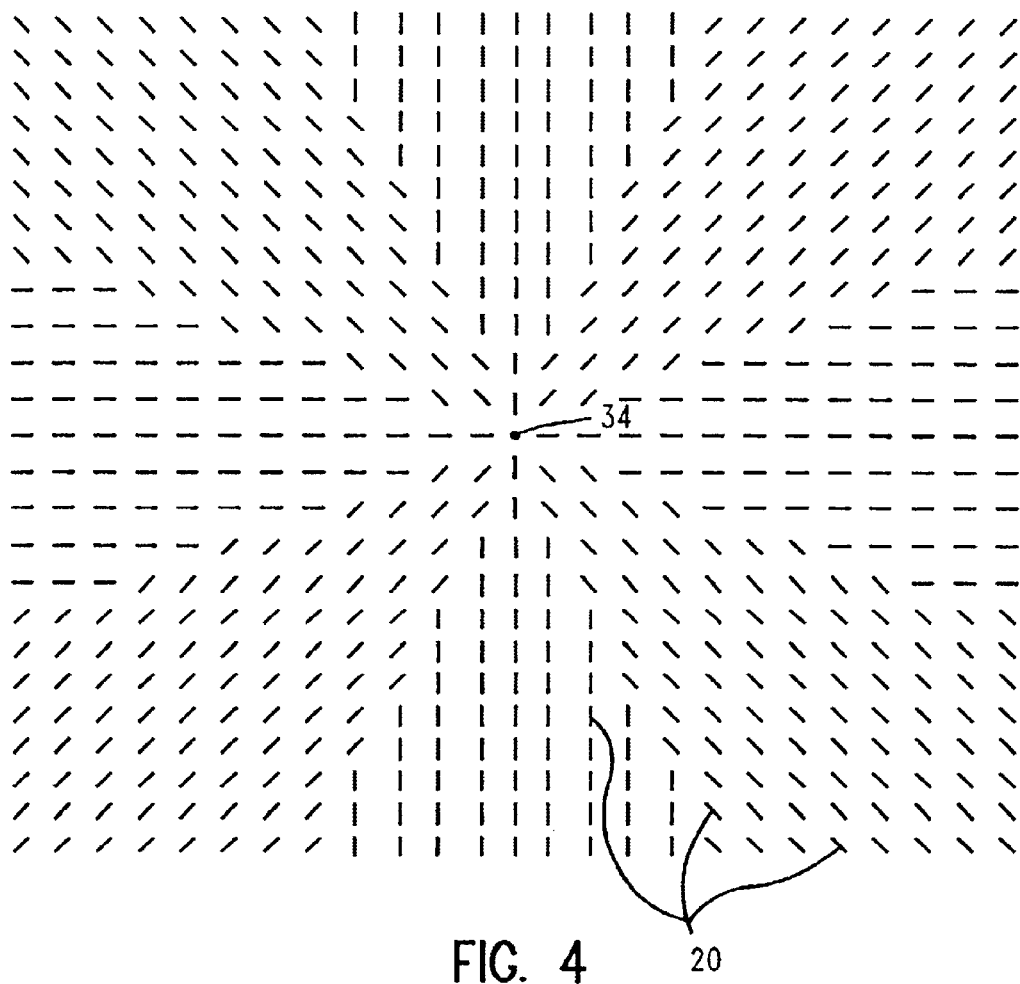
FIG. 4 depicts the metal strap-single via configuration of FIG. 3 with a plurality of straps vectored towards the substrate center.

The straps 20 may also be directionally located toward the substrate center. FIG. 4 depicts the metal strap-single via configuration of FIG. 3 with a plurality of straps 20 vectored towards the substrate center 34.

In another embodiment of the instant invention, once the locations of the internal anchor vias or strap vias are redirected to lower local distance-to-neutral points, still within the same I/O capture pads, directed towards the center of the substrate, the single vias are then placed at the strap end closest the substrate center. This placement puts each via at a location of lower applied stress. The new locations improve the reliability of multilayered ceramic substrates having a plurality of vias, such as high performance glass ceramic CBGA/CCGA packages. This embodiment of the instant invention uses the area available on the I/O pad to place the interlayer via at a lower local distance-to-neutral point, preferably underneath and in electrical contact with the circumferential via in the layer above. The anchor layer is then used to jog the signal via to its connection point with the next layer. This configuration has the benefit of eliminating the potential for cracks on the surface because of the elimination of a full-size I/O pad on the BSM-1 layer. It also solves the problem of early failures on high local DNP vias. Moreover, it allows increased application space for the package, which is beneficial during cold-start applications, and is a more robust structure, which can accommodate manufacturing variables.

Figure 5:
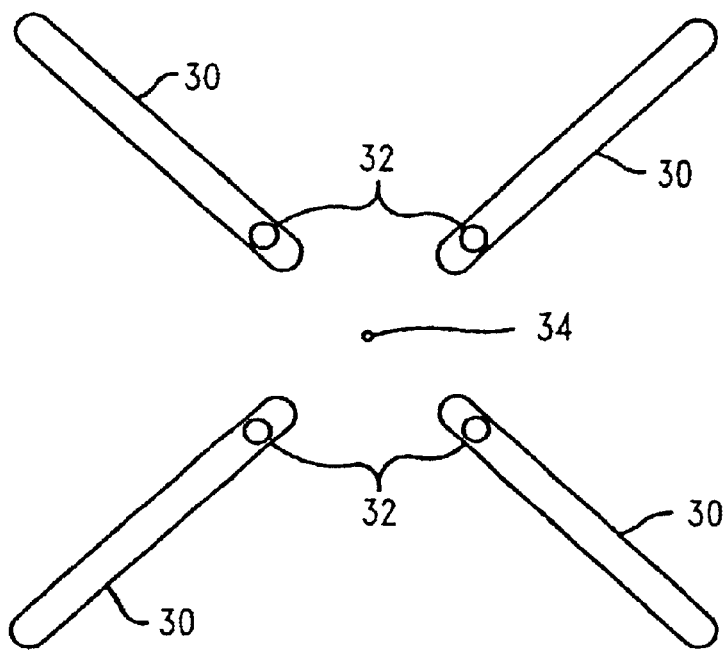
FIG. 5 depicts an elevated view of four multiple straps with single vias attached at locations closest to the substrate center.
Figure 6:
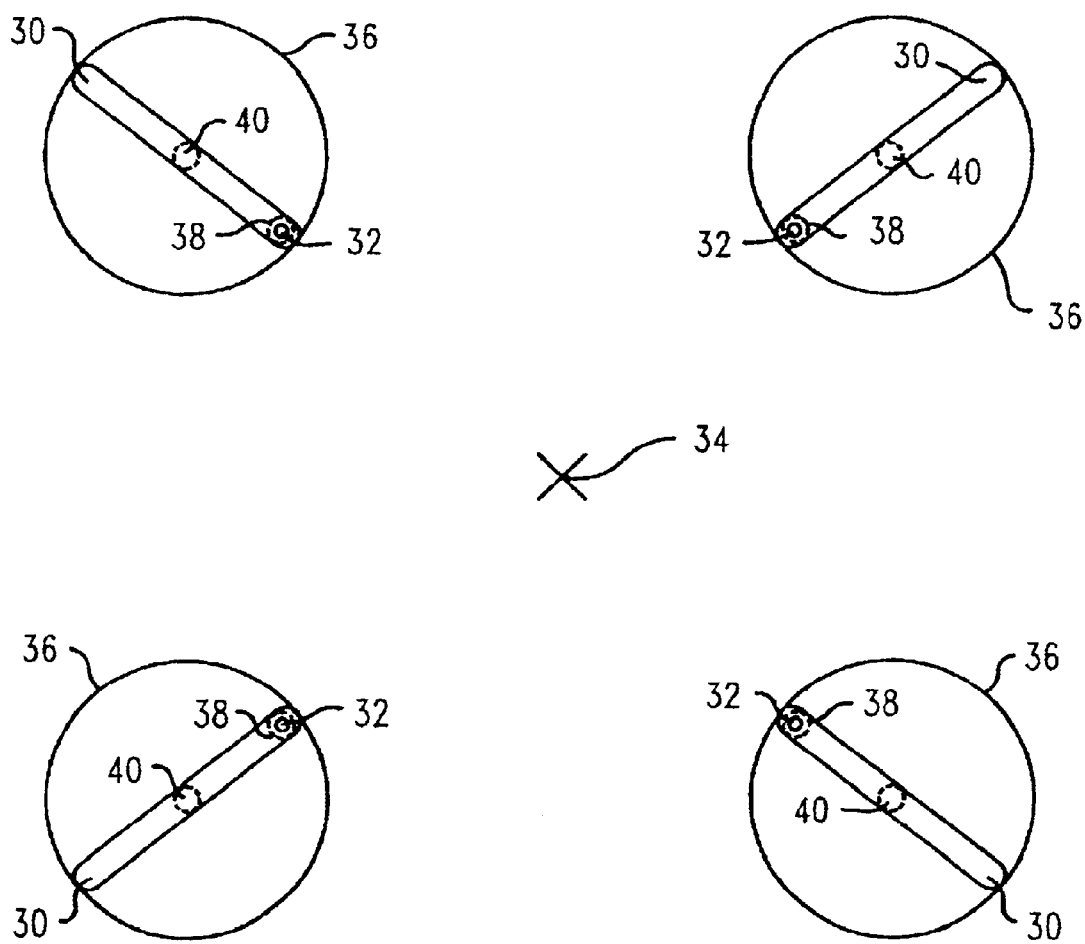
FIG. 6 is an elevated view of a multilayered ceramic substrate depicting each single via shown in relation to the footprint of an I/O pad above it.

FIG. 5 depicts an elevated view of four multiple straps 30 with single vias 32 attached at locations closest to the substrate center 34. The closer distance to the substrate center significantly reduces the stress and fatigue on each via. The straps 30 are directed or angled toward the substrate center 34, placed at each strap end closest the center. Preferably, each single via 32 corresponds to a circumferential via of the representative I/O pad above it. FIG. 6 is an elevated view of a multilayered ceramic substrate depicting each single via 32 shown in relation to the footprint of an I/O pad 36 above it. Straps 30 connect the single via 32 to at least one of the circumferential vias 38 and center via 40, having footprints indicated by dotted lined circles.

The instant invention provides for a reduction in leakage and parasitic capacitance of multilayered ceramic substrates during high frequency operation by reducing the number of vias associated with inter-layer connections. In one embodiment, in the first layer in from the bottom surface metallurgy (BSM), the BSM-1 layer, each contact pad for contacting vias from the BSM layer is replaced by a metal strap. The straps traverse the diameter of an I/O pad, and are aligned to point towards the center of the substrate. In a second embodiment, the vias that connect the metal straps to the I/O pad vias in the layer above are located at the end of the strap that is nearest to the center of the substrate.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A multilayer ceramic package comprising:
   a plurality of ceramic layers having conductors thereon, including a first outer layer and a second layer adjacent to said first outer layer, wherein said first outer layer includes a plurality of contact pads, each of said contact pads electrically connecting to a plurality of vias, said first outer layer and said second layer each having a center location;
   said plurality of vias extending from said outer layer to said second layer;
   a plurality of metallic straps on said second layer corresponding to and contacting said plurality of vias.

2. The multi layer ceramic package af claim 1 further comprising having each of said plurality of metallic straps connect to a single via, such that each of said portion of said plurality vias is electrically connected to said single via of said metallic strap.

3. The multilayer ceramic package of claim 2 including center vias electrically connected to each of said contact pads, each of said center vias directly above, corresponding to, and individually connected to, one of said single vias.

4. The multilayer ceramic package of claim 1 further comprising said metallic straps having a length and a width, said length greater than said width, and said length extending diametrically across said contact pad.

5. The multilayer ceramic package of claim 1 including having all of said metallic straps aligned in such a manner as to point to said center location of said second layer.

6. A multilayered ceramic substrate having a substrate center, comprising:
   a first outer layer having a plurality of I/O pads, each of said I/O pads having a plurality of I/O pad vias including a center via;
   a plurality of single vias in a second layer corresponding to each of said I/O pads, each of said single vias located underneath and in electrical contact with one of said plurality of I/O pad vias, and one of said I/O pad center vias; and
   a plurality of metallic straps, each one corresponding to each of said single vias in said second layer, electrically connecting said single vias with one of said plurality of I/O pad vias and one of said I/O pad center vias.

7. The multilayer ceramic package of claim 6 including having said metallic straps aligned in such a manner as to point to said substrate center.

8. The multilayer ceramic package of claim 6 including having said plurality of I/O pad vias located about said I/O pad in a circular fashion, forming circumferential vias and said center via.

9. The multilayer ceramic package of claim 8 wherein each of said single vias are located directly underneath said circumferential via closest to said substrate center.

10. The multilayer ceramic package of claim 6 including having said metallic straps aligned in such a manner as to point to the center of said second layer.

11. The multilayer ceramic package of claim 10 wherein each of said single vias are located directly underneath said circumferential via closest to said center of said second layer.

* * * * *